United States Patent
Trinh et al.

(10) Patent No.: US 11,024,800 B2
(45) Date of Patent: *Jun. 1, 2021

(54) FILM SCHEME TO IMPROVE PEELING IN CHALCOGENIDE BASED PCRAM

(71) Applicant: Taiwan Semiconductor Manufacturing Co., Ltd., Hsin-Chu (TW)

(72) Inventors: Hai-Dang Trinh, Hsinchu (TW); Chin-Wei Liang, Zhubei (TW); Hsing-Lien Lin, Hsin-Chu (TW); Fa-Shen Jiang, Taoyuan (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/750,145

(22) Filed: Jan. 23, 2020

(65) Prior Publication Data

US 2020/0161544 A1 May 21, 2020

Related U.S. Application Data

(63) Continuation of application No. 16/207,506, filed on Dec. 3, 2018, now Pat. No. 10,622,555.

(60) Provisional application No. 62/712,373, filed on Jul. 31, 2018.

(51) Int. Cl.
*H01L 45/00* (2006.01)
*H01L 27/24* (2006.01)
*G11C 13/00* (2006.01)

(52) U.S. Cl.
CPC .......... *H01L 45/06* (2013.01); *G11C 13/0004* (2013.01); *H01L 27/2436* (2013.01); *H01L 45/144* (2013.01); *H01L 45/1608* (2013.01); *H01L 45/1675* (2013.01)

(58) Field of Classification Search
CPC ..... H01L 45/04; H01L 45/06; H01L 45/1233; H01L 45/1253
See application file for complete search history.

(56) References Cited

U.S. PATENT DOCUMENTS

| | | | |
|---|---|---|---|
| 8,530,875 B1 | 9/2013 | Chang et al. | |
| 8,859,344 B2 | 10/2014 | Matsui et al. | |
| 9,172,036 B2 | 10/2015 | Chen et al. | |
| 9,419,212 B2 * | 8/2016 | Petz | H01L 45/12 |
| 10,276,485 B2 | 4/2019 | Chen et al. | |
| 10,276,779 B2 | 4/2019 | Chang et al. | |
| 2007/0029676 A1 | 2/2007 | Takaura et al. | |

(Continued)

OTHER PUBLICATIONS

Stout, et al. "Gettering of Gas by Titanium." Journal of Applied Physics 26, 1488 (1955); doi: 10.1063/1.1721936.

(Continued)

*Primary Examiner* — Allison Bernstein
(74) *Attorney, Agent, or Firm* — Eschweiler & Potashnik, LLC

(57) ABSTRACT

Various embodiments of the present disclosure are directed towards a memory cell. The memory cell includes a bottom electrode overlying a substrate. A data storage structure overlies the bottom electrode. A top electrode overlies the data storage structure. Sidewalls of the top electrode and sidewall of the bottom electrode are aligned. Further, a getter layer abuts the bottom electrode.

20 Claims, 13 Drawing Sheets

(56) References Cited

U.S. PATENT DOCUMENTS

2011/0059576 A1     3/2011   Cho et al.
2012/0307555 A1   12/2012   Liu
2014/0268993 A1     9/2014   Chiang et al.

OTHER PUBLICATIONS

Non-Final Office Action dated Jul. 1, 2019 for U.S. Appl. No. 16/207,506.
Final Office Action dated Oct. 7, 2019 for U.S. Appl. No. 16/207,506.
Notice of Allowance dated Dec. 11, 2019 for U.S. Appl. No. 16/207,506.

* cited by examiner

FILM SCHEME TO IMPROVE PEELING IN CHALCOGENIDE BASED PCRAM

REFERENCE TO RELATED APPLICATION

This Application is a Continuation of U.S. application Ser. No. 16/207,506, filed on Dec. 3, 2018, which claims the benefit of U.S. Provisional Application No. 62/712,373, filed on Jul. 31, 2018. The contents of the above-referenced Patent Applications are hereby incorporated by reference in their entirety.

BACKGROUND

Flash memory is a widely used type of nonvolatile memory. However, flash memory is expected to encounter scaling difficulties. Therefore, alternatives types of nonvolatile memory are being explored. Among these alternatives types of nonvolatile memory is phase change memory (PCM). PCM is a type of nonvolatile memory in which a phase of a phase change element is employed to represent a unit of data. PCM has fast read and write times, non-destructive reads, and high scalability.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
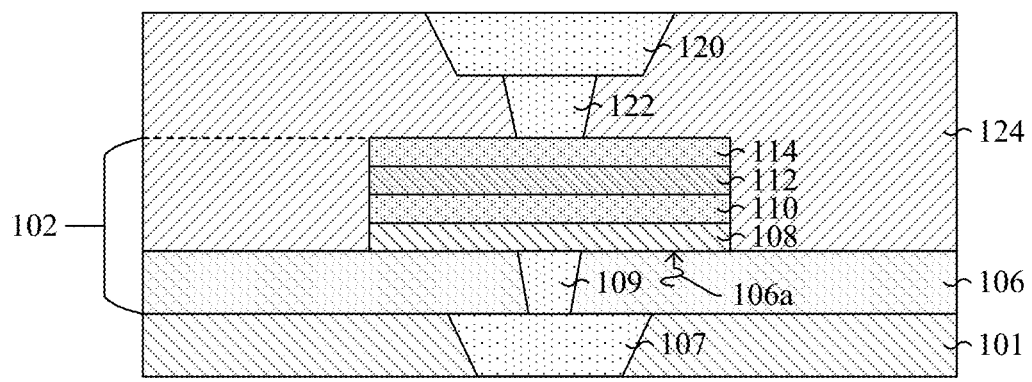
FIG. 1A illustrates a cross-sectional view of some embodiments of a memory device including a phase change element (PCE) and a getter metal layer.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A phase change memory (PCM) cell includes a bottom electrode, a top electrode, a dielectric layer, a heating element, and a phase change element (PCE). The dielectric layer is disposed below the bottom electrode and the PCE is stacked between the bottom and top electrodes. Further, the heating element extends from the bottom electrode, through the dielectric layer, to an underlying metal wire. The PCE has a variable phase representing a bit of data. In operation, the heating element heats the PCE to change the PCE between an amorphous phase and a crystalline phase.

During a method for manufacturing the PCM cell, formation of layers after forming a PCM cell stack may be formed with high thermal heat (e.g. 400 degrees Celsius). More specifically, a hard mask layer used to pattern the PCM cell stack and define the PCM cell may, for example, be formed with high thermal heat. Additionally, during operation of the PCM cell, changing the PCE to the crystalline phase (e.g., programming the PCM cell, 'SET', or '1') may, for example, be performed at a low temperature (e.g., about 100-150 degrees Celsius) since low power may be used to crystallize the PCE. However, changing the PCE to the amorphous phase (e.g., erasing the PCM cell, 'RESET', or a '0') may, for example, be performed at a high temperature (e.g., greater than about 700 degrees Celsius) since high power may be used to melt the PCE. The high temperature may, for example, be exacerbated by a majority of heat diffusing to structures other than the PCE (e.g., the dielectric layer and the bottom electrode).

Outgassing of an outgas species (outgas species can include hydrogen ($H_2$) and/or tetrahydrogen ($H_4$)) can occur from the dielectric layer to the PCE. Outgassing onsets at 150 degrees Celsius and increases with increasing temperatures. The outgas species collects between the bottom electrode and the PCE. The collecting can cause delamination and/or bubbling at an interface between the bottom electrode and the PCE. The bubbling and/or delamination is/are exacerbated by poor adhesion between the PCE and the bottom electrode, and may reduce the PCM cell's stability, endurance, and switching time.

In some embodiments of the present disclosure, to eliminate the bubbling and delamination issues of the PCM cell during manufacturing and operation, a getter layer may be disposed between the PCE and the dielectric layer. The getter layer is comprised of material(s) that will absorb and/or block the outgas species, preventing the bubbling and delamination issues from occurring in the PCM cell. The getter layer increases the PCM cell's stability, endurance, and switching time.

With reference to FIG. 1A, a cross-sectional view 100a of a memory device comprising a phase change memory (PCM) structure 102 (e.g., a memory cell or some other suitable structure) in accordance with some embodiments is provided. The PCM structure includes a dielectric layer 106, a bottom electrode via 109, a getter layer 108, a first electrode 110, a phase change element (PCE) 112, and a second electrode 114. The getter layer 108 overlies the bottom electrode via 109 and the dielectric layer 106. Further, the getter layer 108 is comprised of a material that absorbs and/or blocks an outgas species from the dielectric layer 106 during operation and formation of the memory device. The outgas species may, for example, be or comprise $H_2$ and/or $H_4$, but other outgas species are amenable.

The dielectric layer 106 and the bottom electrode via 109 are disposed over a first inter-metal dielectric (IMD) layer 101 and a first metal wire 107. Further, the bottom electrode via 109 is electrically coupled to underlying electric components, such as a transistor, a resistor, a capacitor, a selector, and/or a diode, via the first metal wire 107. The first electrode 110 overlies the getter layer 108 and is electrically coupled to the bottom electrode via 109 through the getter layer 108. The PCE 112 is disposed between the first electrode 110 and the second electrode 114. A first conductive via 122 overlies the second electrode 114. A second metal wire 120 is electrically coupled to the second electrode 114 and overlies the first conductive via 122. The second metal wire 120 is electrically coupled to overlying metal wires. A second IMD layer 124 is disposed over and around the PCM structure 102, the first conductive via 122, and the second metal wire 120.

In some embodiments, during operation of the PCM structure 102, the PCM structure 102 varies between states depending upon a voltage applied from the second metal wire 120 to the first metal wire 107. The PCM structure 102 may, for example, be in an ON state (e.g., programmed, 'SET', or '1') where the PCE 112 is in a crystalline phase. Changing the PCE 112 to the crystalline phase may, for example, be performed at a relatively low temperature (e.g., within a range of approximately 100 to 150 degrees Celsius). The PCM structure 102 may, for example, be in an OFF state (e.g., erased, 'RESET', or a '0') where the PCE 112 is in an amorphous phase. Changing the PCE 112 to the amorphous phase may, for example, be performed at a relatively high temperature (e.g., approximately 700 degrees Celsius). The getter layer 108 is configured to prevent (e.g., block and/or absorb) outgassing 106a of the outgas species from the dielectric layer 106 to the first electrode 110 and overlying layers, such as the PCE 112. In some embodiments, the outgas species may, for example, be or comprise hydrogen ($H_2$) and/or tetrahydrogen ($H_4$). Other species are, however, amenable. In some embodiments, outgassing 106a onsets at 150 degrees Celsius and outgassing 106a will increase with increasing temperatures. Thus, the getter layer 108 prevents or limits the outgas species from diffusing through the first electrode 110 and collecting between the first electrode 110 and the PCE 112. By preventing or limiting the collection of outgas species between the first electrode 110 and the PCE 112, the likelihood of delamination and/or bubbling at the interface between the PCE 112 and the first electrode 110 is reduced. Therefore, the getter layer 108 increases the stability and endurance of the PCM structures 102.

In some embodiments, the dielectric layer 106 may, for example, be or comprise of silicon oxide ($SiO_2$), silicon oxynitride (SiON), silicon nitride (SiN), silicon carbide (SiC), or the like. In some embodiments, the getter layer 108 may, for example, be or comprise titanium (Ti), zirconium (Zr), hafnium (Hf), zirconium vanadium iron (ZrVFe), zirconium aluminum iron (ZrAlFe), tungsten titanium (WTi), tungsten titanium nitride (WTiN), hafnium tungsten nitride (HfWN), hafnium tungsten (HfW), titanium hafnium nitride (TiHfN), or the like formed to a thickness within a range of approximately 20 Angstroms to 200 Angstroms, or some other suitable value. In some embodiments, if the getter layer 108 is too thin (e.g., a thickness less than approximately 20 Angstroms) the getter layer 108 may, for example, be ineffective and/or unable to prevent outgassing 106a of the outgas species. In some embodiments, if the getter layer 108 is too thick (e.g., a thickness greater than approximately 200 Angstroms) the getter layer 108 may, for example, have a high resistance that will negatively impact the electrical performance of the PCM structure 102. In some embodiments, the getter layer 108 comprises a material with metal grains that are small compared to the first electrode 110, so grain boundaries of the getter layer 108 are too small for the outgas species to diffuse or otherwise move through the getter layer 108 along the grain boundaries. In some embodiments, the getter layer 108 comprises a first material with a first reactivity and the first electrode 110 comprises a second material with a second reactivity. In some embodiments, the second reactivity is less reactive to the outgas species than the first reactivity, such that the getter layer 108 may, for example, absorb the outgas species before the outgas species can reach the first electrode 110.

In some embodiments, the first electrode 110 may, for example, be or comprise titanium nitride (TiN), titanium tungsten (TiW), titanium tungsten nitride (TiWN), titanium tantalum nitride (TiTaN), tantalum nitride (TaN), tungsten (W), tungsten nitride (WN), hafnium nitride (HfN), tungsten titanium (WTi), tungsten titanium nitride (WTiN), hafnium tungsten nitride (HfWN), hafnium tungsten (HfW), titanium hafnium nitride (TiHfN), or the like. In some embodiments, the second electrode 114 may, for example, be or comprise titanium nitride (TiN), titanium tungsten (TiW), titanium tungsten nitride (TiWN), titanium tantalum nitride (TiTaN), tantalum nitride (TaN), tungsten (W), tungsten nitride (WN), hafnium nitride (HfN), tungsten titanium (WTi), tungsten titanium nitride (WTiN), hafnium tungsten nitride (HfWN), hafnium tungsten (HfW), titanium hafnium nitride (TiHfN), or the like. In some embodiments, the second electrode 114 and the first electrode 110 are the same material. In some embodiments the second electrode 114 and the first electrode 110 are a different material than the getter layer 108. In some embodiments, the PCE 112 may, for example, be or comprise chalcogenide materials, which consist of at least one chalcogen ion (e.g., a chemical element in column VI of the period table), sulfur (S), selenium (Se), tellurium (Te), selenium sulfide (SeS), germanium antimony tellurium (GeSbTe), silver indium antimony tellurium (AgInSbTe), or the like. In some embodiments, the PCE 112 may, for example, be or comprise a germanium tellurium compound (GeTeX), an arsenic tellurium compound (AsTeX), or an arsenic selenium compound (AsSeX) where X may, for example, be or comprise elements like germanium (Ge), silicon (Si), gallium (Ga), lanthanide (ln), phosphorus (P), boron (B), carbon (C), nitrogen (N), oxygen (O), a combination of the foregoing, or the like.

Figure 1B:
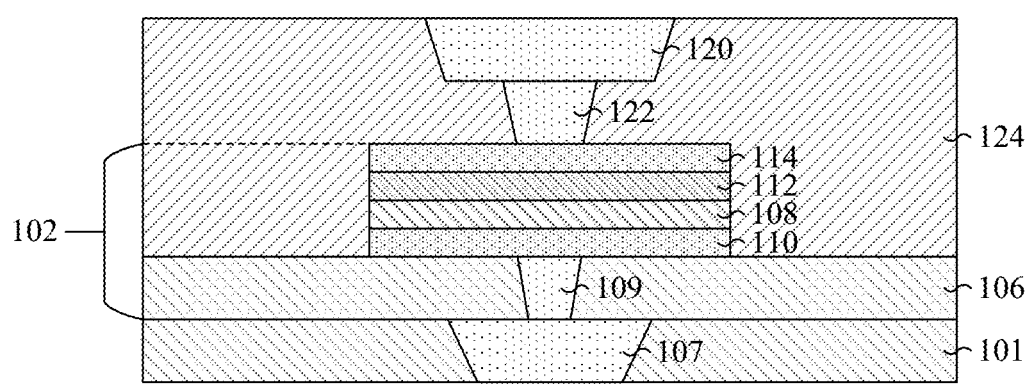
FIGS. 1B-1E illustrate cross-sectional views of various alternative embodiments of the memory device of FIG. 1A.

With reference to FIG. 1B, a cross-sectional view 100b of some alternative embodiments of the memory device of FIG. 1A is provided in which the getter layer 108 is disposed between the first electrode 110 and the PCE 112. In some embodiments, the first electrode 110 is in direct contact with the bottom electrode via 109 and the dielectric layer 106.

Figure 1C:
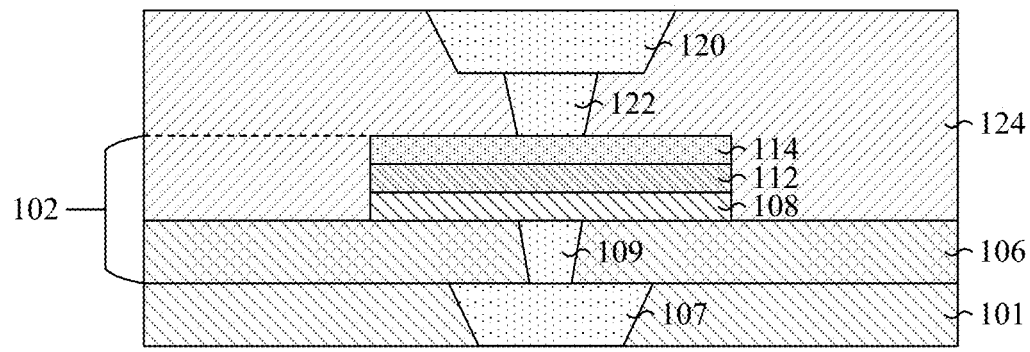

With reference to FIG. 1C, a cross-sectional view 100c of some alternative embodiments of the memory device of FIG. 1A is provided in which the first electrode (110 of FIG. 1A) is omitted and the getter layer 108 is in direct contact with the PCE 112 and the bottom electrode via 109. In such alternative embodiments, the getter layer 108 acts as a bottom electrode.

Figure 1D:
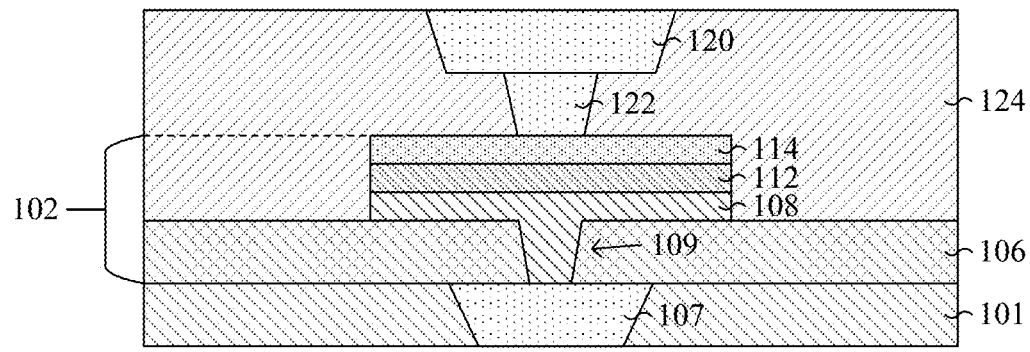

With reference to FIG. 1D, a cross-sectional view 100d of some alternative embodiments of the memory device of FIG. 1A is provided in which the first electrode (110 of FIG. 1A) is omitted. Further, the getter layer 108 comprises a protrusion that extends through the dielectric layer 106 and defines the bottom electrode via 109.

Figure 1E:
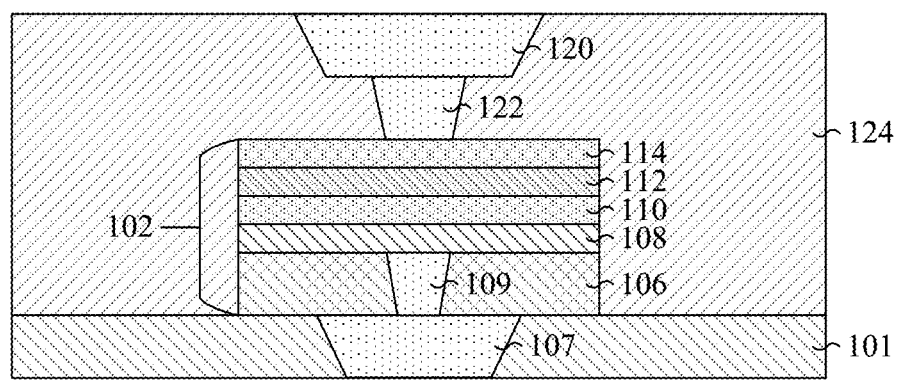

With reference to FIG. 1E, a cross-sectional view 100e of some alternative embodiments of the memory device of FIG. 1A is provided in which sidewalls of the second electrode 114, the PCE 112, the first electrode 110, the getter layer 108, and the dielectric layer 106 are aligned.

Figure 1F:
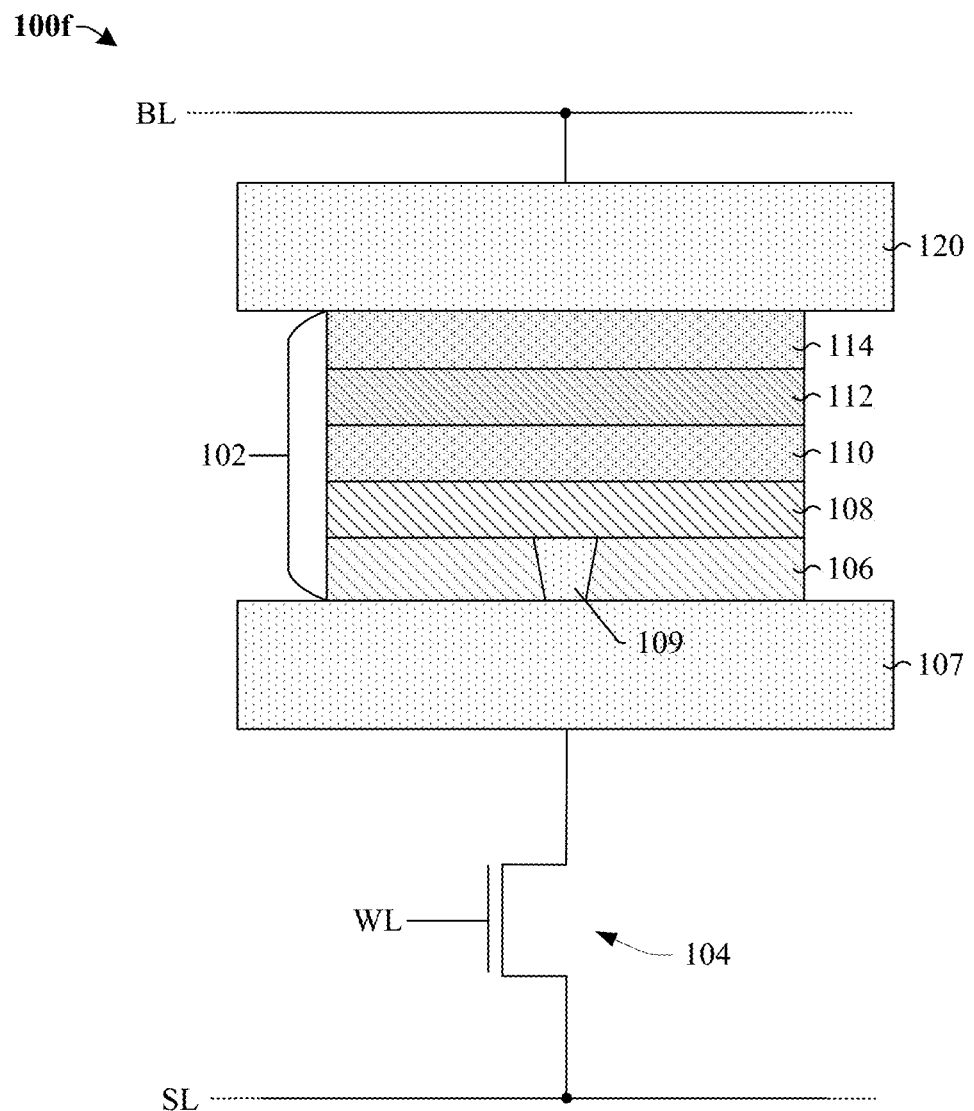
FIG. 1F illustrates a schematic diagram of some alternative embodiments of the memory device of FIG. 1A in which the memory device comprises an access transistor.

With reference to FIG. 1F, a schematic diagram 100f of some alternative embodiments of the memory device of FIG. 1A is provided in which the memory device includes an access transistor 104. The access transistor 104 is coupled to the PCM structure 102 by the first metal wire 107. A bit line (BL) is coupled to one end of the PCM structure 102 through the second electrode 114 and the second metal wire 120, and a source line (SL) is coupled to an opposite end of the PCM structure 102 through the access transistor 104 and the first metal wire 107. Thus, application of a suitable word line (WL) voltage to a gate electrode of the access transistor 104 couples the PCM structure 102 between the BL and the SL. Consequently, by providing suitable bias conditions, the PCM structure 102 can be switched between two states of electrical resistance, a first state with a low resistance and a second state with a high resistance, to store data. In some embodiments, a via exists between and electrically couples the bottom electrode via 109 and the first metal wire 107. In some embodiments, a via exists between and electrically couples the second electrode 114 and the second metal wire 120.

Figure 2A:
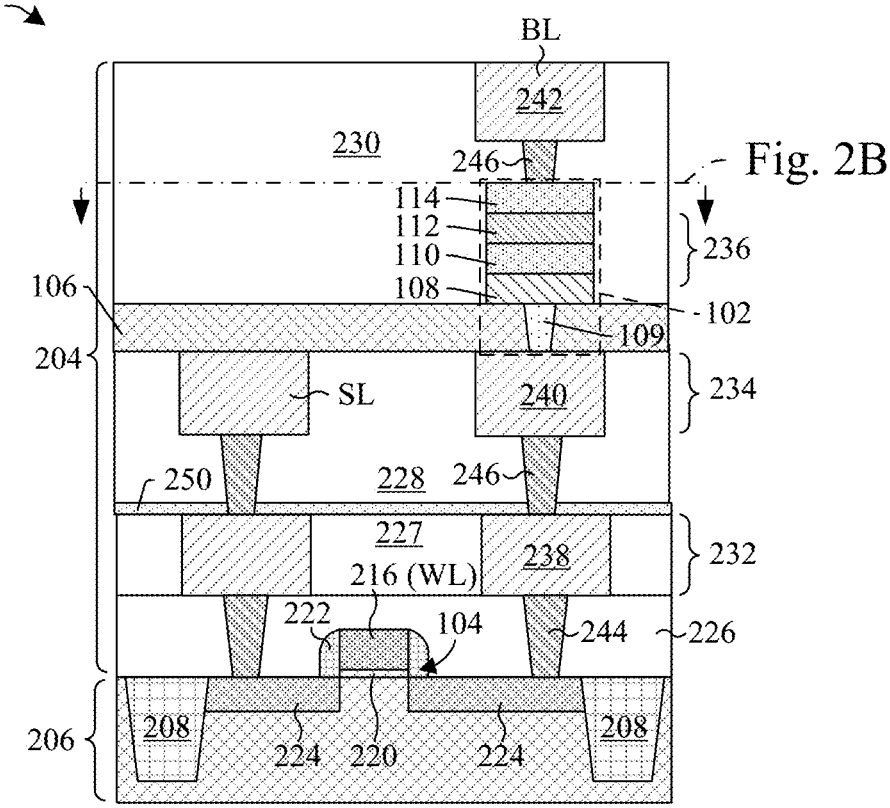
FIG. 2A illustrates a cross-sectional view of some alternative embodiments of the memory device of FIG. 1F.

With reference to FIG. 2A, a cross-sectional view 200a of some alternative embodiments of the memory device of FIG. 1F is provided in which the memory device includes a PCM structure 102 (e.g., a memory cell and/or a resistor) disposed in an interconnect structure 204 configured for a one-transistor one-memory cell (1T1MC) setup. The memory device includes a substrate 206. The substrate 206 may be, for example, a bulk substrate (e.g., a bulk silicon substrate) or a silicon-on-insulator (SOI) substrate. The illustrated embodiment depicts one or more shallow trench isolation (STI) regions 208, which may include a dielectric-filled trench within the substrate 206.

An access transistor 104 is disposed between the STI regions 208. The access transistor 104 includes access gate electrode 216, access gate dielectric 220, access sidewall spacers 222, and source/drain regions 224. The source/drain regions 224 are disposed within the substrate 206 between the access gate electrode 216 and respectively the STI regions 208. Further, the source/drain regions 224 are doped to have a first conductivity type which is opposite a second conductivity type of a channel region under the gate dielectric 220. The access gate electrode 216 may, for example, define a word line (WL) or may, for example, electrically couple to a word line. Further, the access gate electrode 216 may be, for example, doped polysilicon or a metal, such as aluminum, copper, or combinations thereof. The access gate dielectric 220 may be, for example, an oxide, such as silicon dioxide, or a high-K dielectric material. The access sidewall spacers 222 can be made of silicon nitride (e.g., $Si_3N_4$), for example.

The interconnect structure 204 is arranged over the substrate 206 and couples devices (e.g., access transistor 104 and the PCM structure 102) to one another. The interconnect structure 204 includes an interlayer dielectric (ILD) layer 226 and a plurality of inter-metal dielectric (IMD) layers 227, 228, 230, and further includes a plurality of metallization layers 232, 234, 236. The ILD and IMD layers 226, 227, 228, 230 may be made, for example, of a low κ dielectric, such as un-doped silicate glass, or an oxide, such as silicon dioxide, or an extreme low κ dielectric layer. The metallization layers 232, 234, 236 include metal lines 238, 240, 242, which may be made of a metal, such as copper or aluminum. Contacts 244 extend from the bottom metallization layer 232 to the source/drain regions 224 and/or gate electrode 216; and vias 246 extend between the metallization layers 232, 234, 236. The contacts 244 and the vias 246 may, for example, extend through a dielectric-protection layer 250 (which can be made of dielectric material and can act as an etch stop layer during manufacturing). The dielectric-protection layer 250 may be made of SiC, for example. The contacts 244 and the vias 246 may be made of a metal, such as copper or tungsten, for example. Other materials for the dielectric protection layer 250, the contacts 244, the vias 246, or any combination of the foregoing are, however, amenable.

The PCM structure 102, which is configured to store data states, is arranged within the interconnect structure 204 between neighboring metal layers. The PCM structure 102 includes a dielectric layer 106, a bottom electrode via 109, a getter layer 108, a first electrode 110, a phase change element (PCE) 112, and a second electrode 114.

Figure 2B:
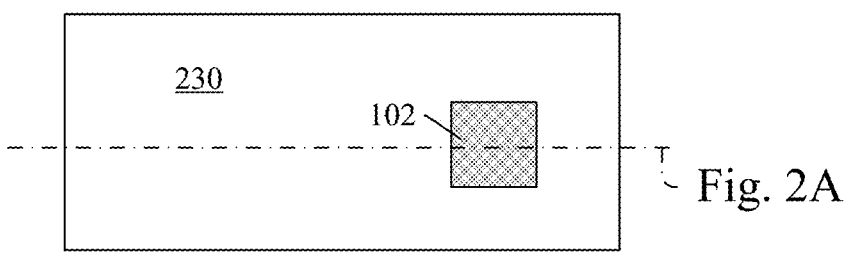
FIG. 2B illustrates a top view of some embodiments of the memory device of FIG. 2A, as indicated by the cut-lines in FIG. 2A.

FIG. 2B depicts some embodiments of a top view of FIG. 2A's memory device as indicated in the cut-away lines shown in FIGS. 2A and 2B. As can be seen, the PCM structure 102 can have a square or circular shape when viewed from above in some embodiments. In other embodiments, however, for example due to practicalities of many etch processes, the corners of the illustrated square shape can become rounded, resulting in PCM structure 102 having a square shape with rounded corners, or having a circular shape. In some embodiments, the PCM structure 102 is arranged over metal lines (240 of FIG. 2A), respectively, and have upper portions in direct electrical connection with the metal lines (242 of FIG. 2A), respectively, without vias or contacts there between. In other embodiments, vias or contacts couple the upper portion to the metal lines (242 of FIG. 2A).

Figure 3A:
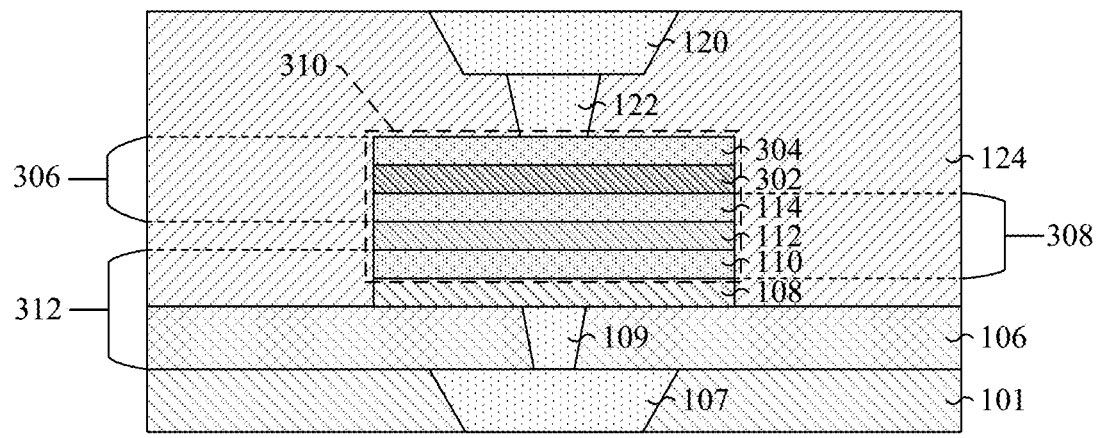
FIGS. 3A and 3B illustrate cross-sectional views of various alternative embodiments of the memory device of FIG. 1A including a selector and a memory cell.

With reference to FIG. 3A, a cross-sectional view 300a of some alternative embodiments of the memory device of FIG. 1A is provided in which a memory cell 306 overlies a selector 308. The selector 308 includes a PCE 112 disposed between a second electrode 114 and a first electrode 110. The memory cell 306 includes a second PCE 302 disposed between a third electrode 304 and the second electrode 114. The selector 308 and memory cell 306 form a one-selector one-memory cell (1S1MC) stack 310. The 1S1MC stack 310 is disposed over a heater 312. The heater 312 includes the first electrode 110 over a getter layer 108 and a bottom electrode via 109 beneath the getter layer 108. In various embodiments, the heater 312 is a single continuous layer extending through the dielectric layer 106 to a bottom surface of the PCE 112.

In some embodiments, the third electrode 304 may, for example, be or comprise titanium nitride (TiN), titanium tungsten (TiW), titanium tungsten nitride (TiWN), titanium tantalum nitride (TiTaN), tantalum nitride (TaN), tungsten (W), tungsten nitride (WN), hafnium nitride (HfN), tungsten titanium (WTi), tungsten titanium nitride (WTiN), hafnium tungsten nitride (HfWN), hafnium tungsten (HfW), titanium hafnium nitride (TiHfN), or the like. In some embodiments, the second PCE 302 may, for example, be or comprise chalcogenide materials, which consist of at least one chalcogen ion (e.g., a chemical element in column VI of the period table), sulfur (S), selenium (Se), tellurium (Te), selenium sulfide (SeS), germanium antimony tellurium (GeSbTe), silver indium antimony tellurium (AgInSbTe), or the like formed. In some embodiments, the second PCE 302 may, for example, be or comprise a germanium tellurium compound (GeTeX), an arsenic tellurium compound (AsTeX), or an arsenic selenium compound (AsSeX) where X may, for example, be or comprise elements like germanium (Ge), silicon (Si), gallium (Ga), lanthanide (ln), phosphorus (P), boron (B), carbon (C), nitrogen (N), oxygen (O), a combination of the foregoing, or the like.

In some embodiments, the memory cell 306 is a PCRAM cell and is configured to store data by a phase of the second PCE 302. In alternative embodiments, the second PCE 302 is replaced with some other suitable data storage structure, such that the memory cell 306 is another type of memory cell. For example, the memory cell 306 may be a resistive random-access memory (RRAM) cell, a magnetoresistive random-access memory (MRAM) cell, a conductive-bridging random-access memory (CBRAM) cell, or some other suitable memory cell.

The selector 308 is configured to switch between a low resistance state and a high resistance state depending on whether a voltage applied across the selector 308 is greater than a threshold voltage. For example, the selector 308 may have a high resistance state if a voltage across the selector 308 is less than the threshold voltage, and the selector 308 may have a low resistance state if a voltage across the selector 308 is greater than the threshold voltage.

Figure 3B:
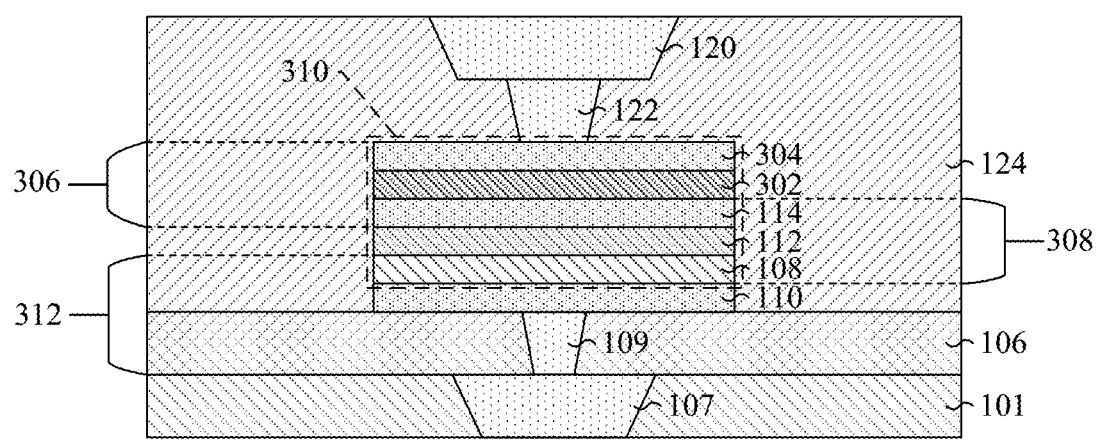

With reference to FIG. 3B, a cross-sectional view 300b of some alternative embodiments of the memory device of FIG. 3A is provided in which the getter layer 108 is disposed between the first electrode 110 and the PCE 112. The first electrode 110 is in direct contact with the bottom electrode via 109 and the dielectric layer 106.

Figure 4:
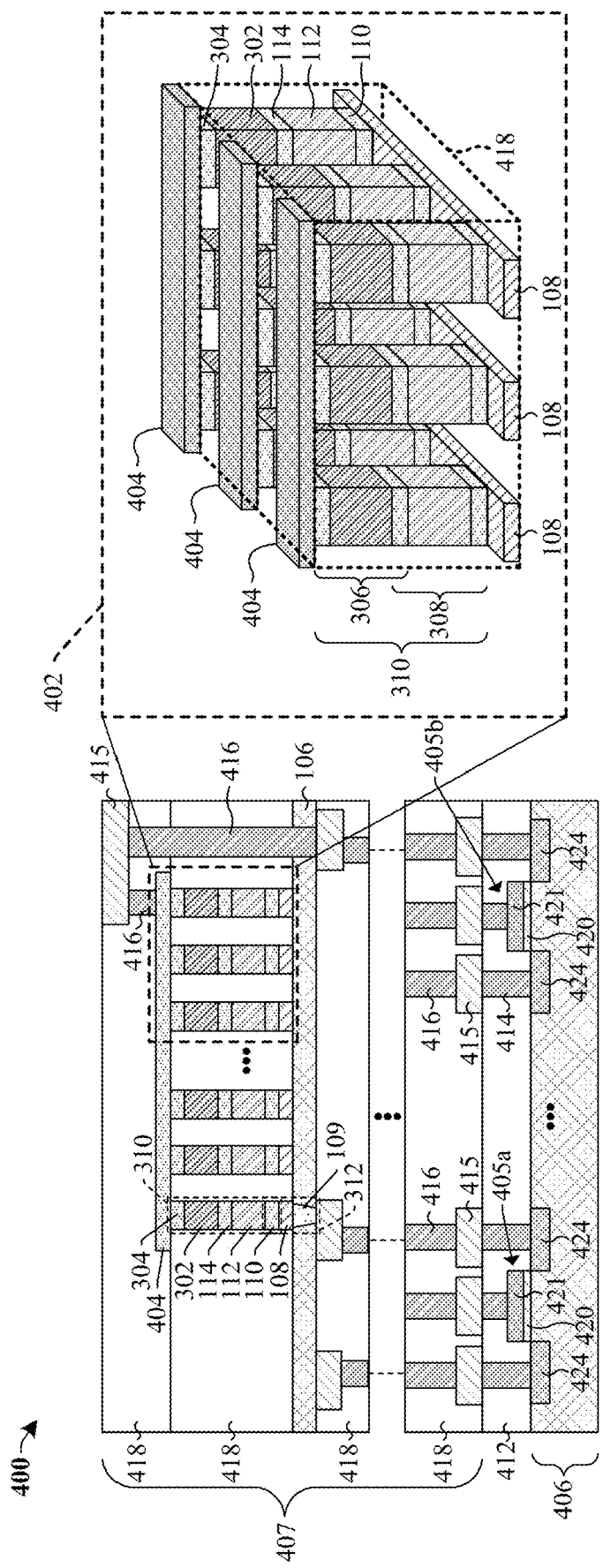
FIG. 4 illustrates a cross-sectional view of some embodiments of an integrated chip (IC) comprising a memory device having a plurality of one-selector one-memory cell (1S1MC) stacks with getter metal layers.

FIG. 4 illustrates a cross-sectional view of some embodiments of an integrated chip (IC) 400 comprising a memory device 402 having a plurality of 1S1MC stacks with getter metal layers.

The IC 400 comprises a first metal-oxide-semiconductor filed-effect transistor (MOSFET) 405a and a second MOSFET 405b disposed on a semiconductor substrate 406. The first and second MOSFETs 405a, 405b respectively comprise a pair of source/drain regions 424 disposed in the semiconductor substrate 406 and laterally spaced apart. A gate dielectric 420 is disposed over the semiconductor substrate 406 between the individual source/drain regions 424, and a gate electrode 421 is disposed over the gate dielectric 420.

An interlayer dielectric (ILD) layer 412 is disposed over the first and second MOSFETs 405a, 405b and the semiconductor substrate 406. The ILD layer 412 comprises one or more ILD materials. In some embodiments, the ILD layer 412 may comprise one or more of a low-k dielectric layer (e.g., a dielectric with a dielectric constant less than about 3.9), an ultra-low-k dielectric layer, or an oxide (e.g., silicon oxide). Conductive contacts 414 are arranged within the ILD layer 412. The conductive contacts 414 extend through the ILD layer 412 to the gate electrode 421 and the pair of source/drain regions 424. In various embodiments, the conductive contacts 414 may comprise, for example, copper, tungsten, or some other conductive material.

An interconnect structure 407 is disposed over the ILD layer 412. The interconnect structure 407 comprises a plurality of inter-metal dielectric (IMD) layers 418. A plurality of conductive wires 415 and a plurality of conductive vias 416 are disposed within the IMD layers 418. The conductive wires 415 and conductive vias 416 are configured to provide electrical connections between various devices disposed throughout the IC 400. In some embodiments, the IMD layers 418 may each comprise a low-k dielectric layer, an ultra-low-k dielectric layer, or an oxide. In various embodiments, the conductive wires 415 and conductive vias 416 may comprise, for example, copper, aluminum, or some other conductive material In various embodiments, the memory device 402 is disposed within the interconnect structure 407. In some embodiments, the memory device 402 is disposed within one of the IMD layers 418. In further embodiments, the memory device 402 may be disposed within multiple IMD layers 418. In such an embodiment, the memory device 402 may comprise multiple layers each comprising a plurality of 1S1MC stacks 310.

The memory device 402 comprises a plurality of first conductive lines 404 (e.g., bit lines). The first conductive lines 404 each extend laterally in a first direction. In various embodiments, the first conductive lines 404 are arranged in parallel with one another. In some embodiments, the plurality of first conductive lines 404 may comprise, for example, copper, aluminum, tungsten, some other suitable conductor, or a combination of the foregoing.

A plurality of getter lines 108 (e.g., word lines) (getter layer 108 of FIG. 3A) are arranged under the plurality of first conductive lines 404. The getter lines 108 each extend laterally in a second direction transverse the first direction. In various embodiments, the getter lines 108 are arranged in parallel with one another. In some embodiments, each getter line 108 in the plurality of getter lines 108 may, for example, be or comprise Ti, Zr, Hf, ZrVFe, ZrAlFe, WTi, WTiN, HfWN, HfW, TiHfN, or a combination of the foregoing. In various embodiments, the bottom electrode via 109 and the getter line 108 are one in the same. In various embodiments, the first electrode 110 and/or the third electrode 304 are omitted, such that the second PCE 302 directly contacts the first conductive line 404 and/or the PCE 112 directly contacts the getter line 108. In various embodiments, the plurality of getter lines 108 are a plurality of second conductive lines respectively comprising, for example, copper, aluminum, tungsten, some other suitable conductor, or a combination of the foregoing.

A plurality of 1S1MC stacks 310 are disposed between the plurality of first conductive lines 404 and the plurality of getter lines 108. In various embodiments, the 1S1MC stacks 310 are arranged in an array having a plurality of rows and a plurality of columns. In some embodiments, an individual first conductive line in the first conductive lines 404 and an individual second conductive line in the plurality of getter lines 108 are coupled to each individual 1S1MC stack 310.

Each 1S1MC stack 310 comprises a memory cell 306 overlying a selector 308. The selector 308 includes a PCE 112 disposed between a second electrode 114 and a first electrode 110. The memory cell 306 includes a second PCE 302 disposed between a third electrode 304 and the second electrode 114. A heater 312 comprises a getter line 108, a first electrode 110 over the getter line 108, and a bottom electrode via 109 within a dielectric layer 106. In various embodiments, the heater 312 is a continuous conductive layer electrically coupling the selector 308 to underlying metal layers configured to prevent outgassing of the outgas species to any overlying layers (e.g., specifically outgas sing to the first electrode 110 and the PCE 112). The PCE 112 is configured to switch between low resistance states and high resistance states depending on whether a voltage applied across the selector 308 exceeds a threshold voltage.

In various embodiments, there are N (N is a whole number 1 or greater) first conductive lines 404 and there are N second MOSFETS 405b. Each of the first conductive lines 404 are electrically coupled to an individual second MOST-FET 405b (e.g., to a source/drain region 424 of each MOSTFET 405b) via conductive wires 415 and conductive vias 416. In various embodiments, there are M (M is a whole number 1 or greater) getter lines 108 and there are M first MOSFETS 405a. Each of the getter lines 108 are electrically coupled to an individual first MOSFET 405a (e.g., to a source/drain region 424 of each MOSTFET 405a) via conductive wires 415 and conductive vias 416 that are disposed beneath the memory device 402.

In some embodiments, each conductive line in the first conductive lines 404 and a respective underlying conductive via (in some embodiments, not shown) define a second heater and each getter line in the plurality of getter lines 108 and a respective overlying bottom electrode via 109 define the heater 312. In the aforementioned embodiment, the heater 312 is in direct contact with the selector 308 and the second heater is in direct contact with the memory cell 306. In some embodiments, the each conductive line (e.g., bit line) in the first conductive lines 404 define the second heater and each getter line (e.g., word line) in the plurality of getter lines 108 define the heater 312.

FIGS. 5-11 illustrate cross-sectional views 500-1100 of some embodiments of a method of forming a memory device including a PCM structure according to the present disclosure. Although the cross-sectional views 500-1100 shown in FIGS. 5-11 are described with reference to a method, it will be appreciated that the structures shown in FIGS. 5-11 are not limited to the method but rather may stand alone separate of the method. Although FIGS. 5-11 are described as a series of acts, it will be appreciated that these acts are not limiting in that the order of the acts can be altered in other embodiments, and the methods disclosed are also applicable to other structures. In other embodiments, some acts that are illustrated and/or described may be omitted in whole or in part.

Figure 5:
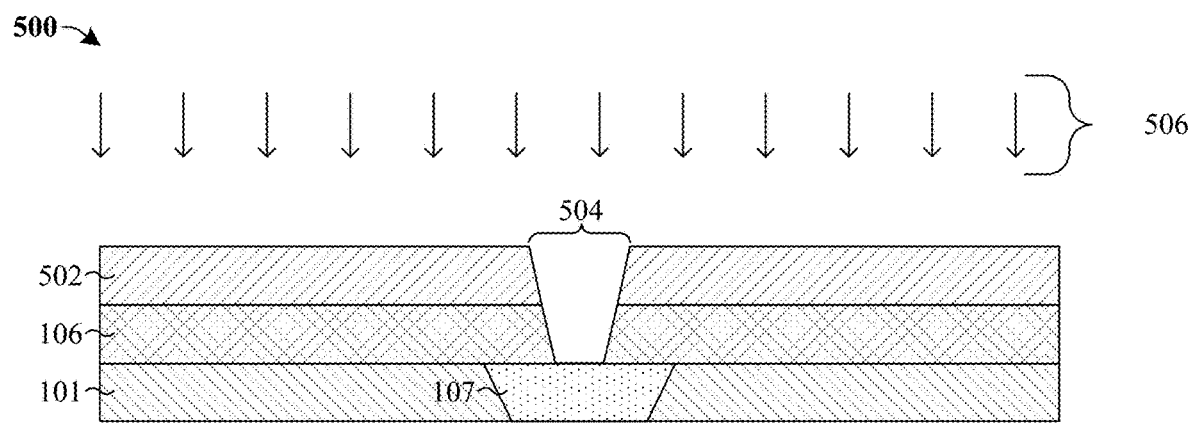
FIGS. 5-11 illustrate cross-sectional views of some embodiments of a method of forming a memory device.

As shown in the cross-sectional view 500 of FIG. 5, a first metal wire 107 is formed within a first IMD layer 101. A dielectric layer 106 is formed over the first metal wire 107 and the first IMD layer 101. A first masking layer 502 is formed over the dielectric layer 106. The first masking layer 502 comprises sidewalls defining an opening 504. The opening 504 is directly above the dielectric layer 106 and the first metal wire 107. In some embodiments, the opening 504 is centered above the first metal wire 107. In some embodiments, the above layers may be formed using a deposition process such as, for example, chemical vapor deposition (CVD), physical vapor deposition (PVD), some other suitable deposition process(es), or any combination of the foregoing.

An etching process is performed to etch a portion of the dielectric layer 106 directly below the opening 504 within the first masking layer 502. The etching process is performed by exposing the portion of the dielectric layer 106 directly below the opening 504 to an etchant 506. The etching process, for example, may be performed by a photolithography/etching process and/or some other suitable patterning process(es).

Figure 6:
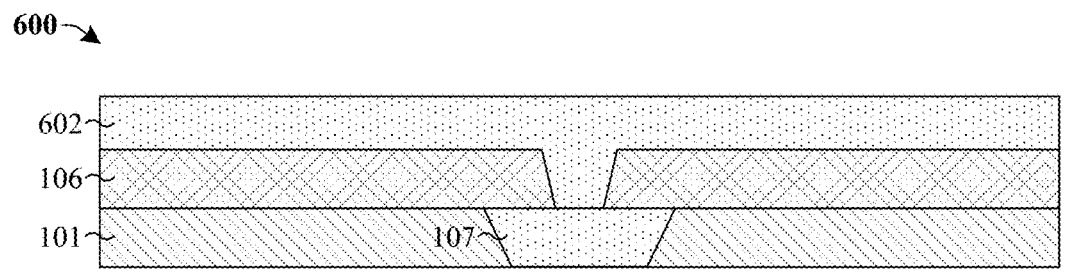

As shown in the cross-sectional view 600 of FIG. 6, depositing a first conductive layer 602 covering the dielectric layer 106 and filling the opening (504 of FIG. 5) in the dielectric layer 106. The depositing may, for example, be performed by CVD, PVD, electroless plating, electroplating, some other suitable deposition process(es), or any combination of the foregoing.

Figure 7:
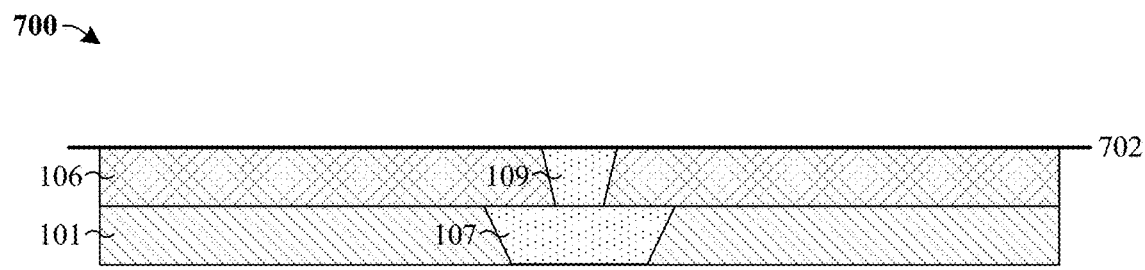

As shown in the cross-sectional view 700 of FIG. 7, a planarization process is performed along a horizontal line 702 on the first conductive layer (602 of FIG. 6) to define a bottom electrode via 109 within the dielectric layer 106. The planarization may, for example, be performed by a CMP and/or some other suitable planarization process(es).

Figure 8:
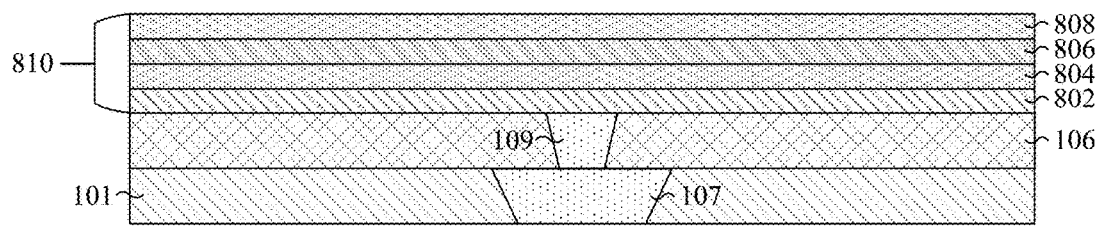

As shown in the cross-sectional view 800 of FIG. 8, a PCM stack 810 is formed over the dielectric layer 106 and the bottom electrode via 109. The PCM stack 810 comprises: a first getter layer 802 overlying the dielectric layer 106; a first metal layer 804 overlying the first getter layer 802; a PCE layer 806 overlying the first metal layer 804; and a second metal layer 808 overlying the PCE layer 806. In alternative embodiments, the first getter layer 802 overlies the first metal layer 804, between the first metal layer 804 and the PCE layer 806. In some embodiments, the above layers may be formed using a deposition process such as, for example, CVD, PVD, some other suitable deposition process(es), or any combination of the foregoing.

Figure 9:
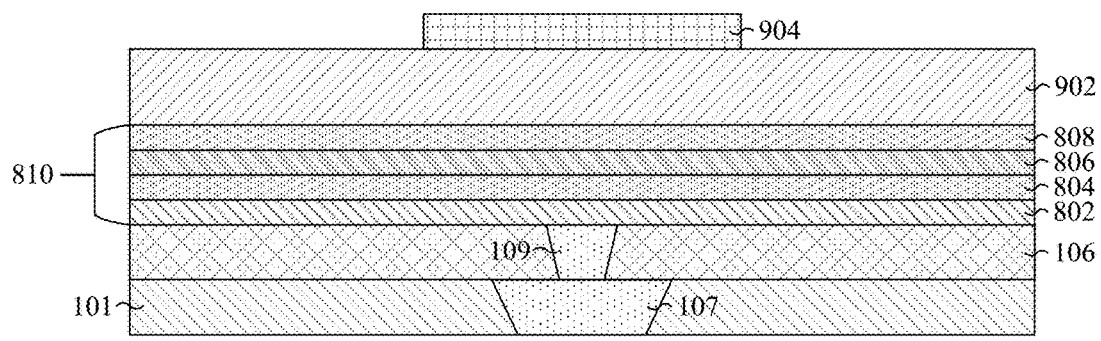

As shown in the cross-sectional view 900 of FIG. 9, a hard mask 902 is formed over the second metal layer 808. A photomask 904 is formed over the hard masking layer 902. The photomask 904 covers a memory region of the hard masking layer 902 and leaves outer regions exposed. In some embodiments, the hard mask 902 may be formed by a first deposition process. The first deposition process, may for example be performed by a CVD, PVD, some other suitable deposition process(es), or any combination of the foregoing. In some embodiments, the first deposition process may, for example, be performed with a high thermal temperature (e.g., approximately 400 degrees Celsius). In some embodiments, the first deposition process is performed by a CVD process with a temperature up to approximately 400 degrees Celsius and the first getter layer 808 prevents and/or blocks outgas sing of the outgas species to layers within the PCM stack 810 above the first getter layer 808. In some embodiments, the photomask 904 is formed by a second deposition process. In some embodiments, the second deposition process is performed by a CVD process with a temperature greater than 150 degrees Celsius and the first getter layer 808 prevents and/or blocks delamination of layers within the PCM stack 810 above the first getter layer 808.

Figure 10:
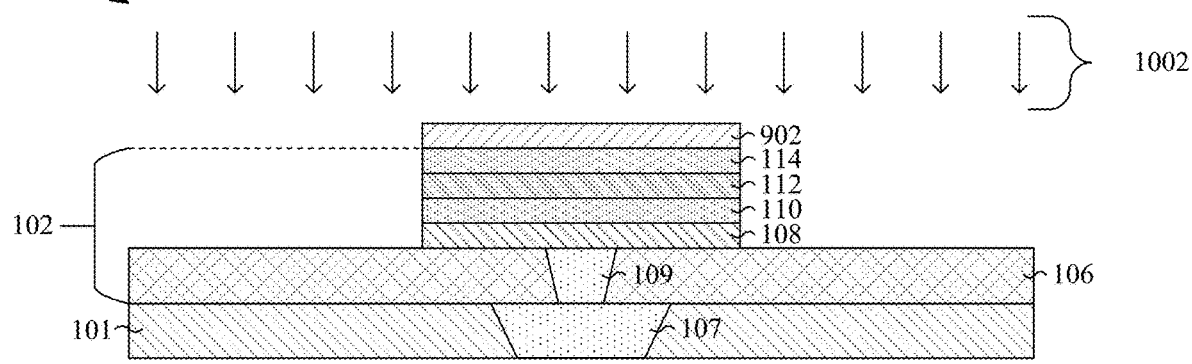

As shown in the cross-sectional view 1000 of FIG. 10, an etching process is performed to remove a portion of the PCM stack (810 of FIG. 9) to sides of the bottom electrode via 109, thereby defining a PCM structure 102. The PCM structure 102 includes the bottom electrode via 109, a getter layer 108, a first electrode 110, a phase change element (PCE) 112, and a second electrode 114. In some embodiments, the etching process is carried out by exposing the hard masking layer (902 of FIG. 9) and the PCM stack (810 of FIG. 9) to an etchant 1002. In some embodiments, after performing the etching process, an etching process or some other suitable process is performed to remove any remaining portion(s) of the hard masking layer (902 of FIG. 9) and the photomask (904 of FIG. 9). In some embodiments, the getter layer 108 prevents and/or blocks delamination (e.g., by preventing outgassing of the outgas species) of layers within the PCM structure 102 above the getter layer 108 from any subsequent processing steps. In some embodiments, the subsequent processing steps may, for example, be or comprise any processing step involving a temperature greater than approximately 150 degrees Celsius, such as a back end of line process (BEOL).

Figure 11:
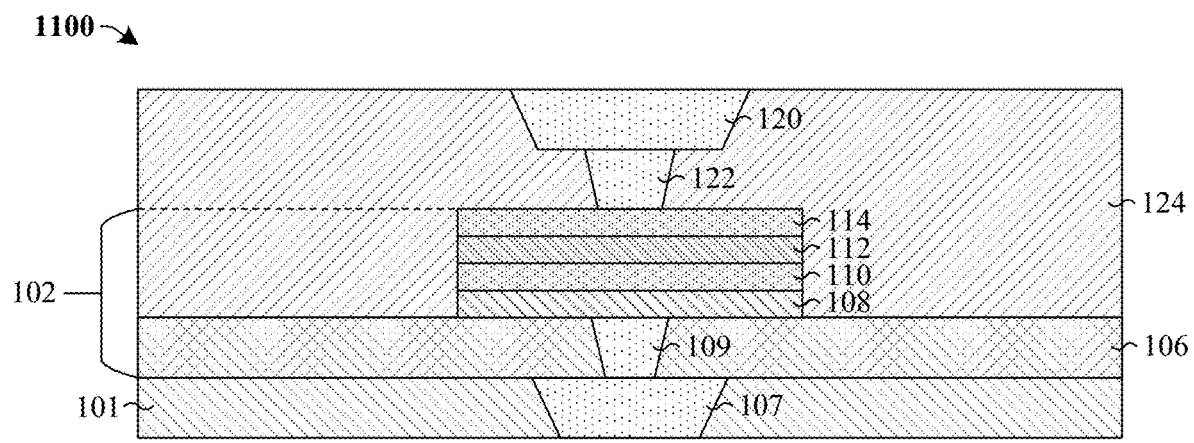

As shown in the cross-sectional view 1100 of FIG. 11, a second IMD layer 124 is formed over the PCM structure 102. In some embodiments, the second IMD layer 124 directly contacts sidewalls of the PCM structure 102. A first conductive via 122 is formed over and directly contacts the second electrode 114. A second metal wire 120 is formed over and directly contacts the first conductive via 122. The second IMD layer 124 may, for example, be formed by CVD, PVD, some other suitable deposition process(es), or any combination of the foregoing. The first conductive via 122 and second metal wire 120 may, for example, be formed by: patterning the second IMD layer 124 to form via openings with a pattern of the first conductive via 122 and/or second metal wire 120; depositing a conductive layer filling the via openings and covering the second IMD layer 124; and performing a planarization into the conductive layer until the second IMD layer 124 is reached. The patterning may, for example, be performed by a photolithography/etching process and/or some other suitable patterning process(es). The depositing may, for example, be performed by CVD, PVD, electroless plating, electroplating, some other suitable deposition process(es), or any combination of the foregoing. The planarization may, for example, be performed by a CMP and/or some other suitable planarization process(es).

Figure 12:
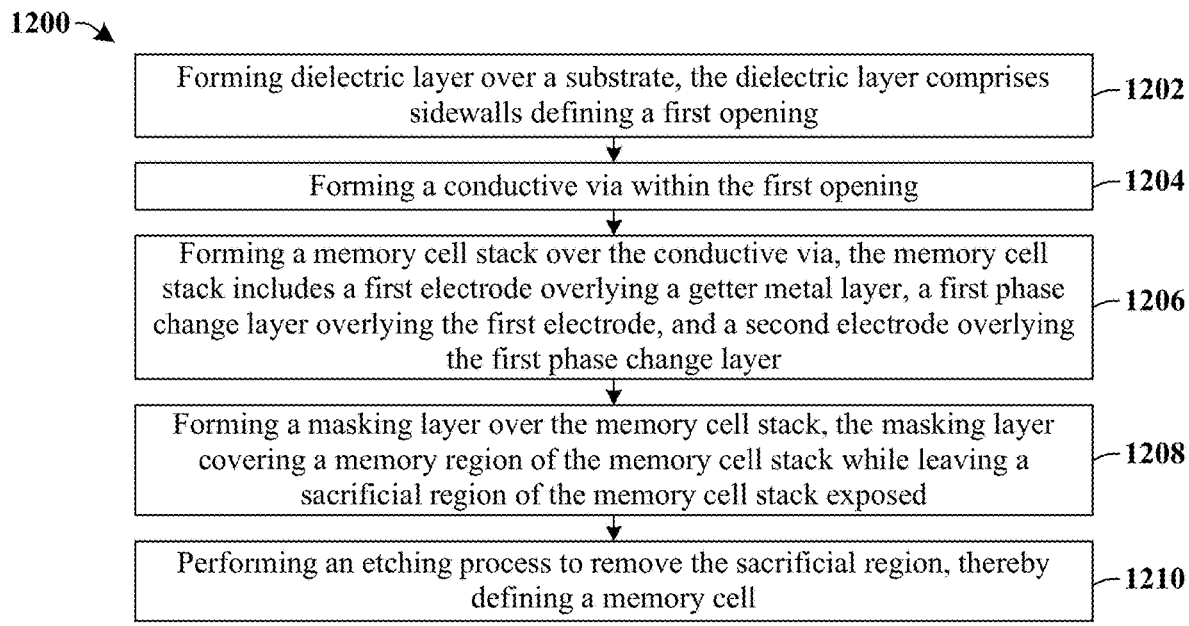
FIG. 12 illustrates a flowchart of some embodiments of the method of FIGS. 5-11.

FIG. 12 illustrates a flowchart 1200 of some embodiments of a method of forming a memory device in accordance with some embodiments. Although the method 1200 is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At 1202, dielectric layer is formed over a substrate, the dielectric layer comprises sidewalls defining a first opening. FIG. 5 illustrates a cross-sectional view 500 corresponding to some embodiments of act 1202.

At 1204, a conductive via is formed within the first opening. FIG. 7 illustrates a cross-sectional view 700 corresponding to some embodiments of act 1204.

At 1206, a memory cell stack is formed over the conductive via, the memory cell stack includes a first electrode overlying a getter metal layer, a first phase change layer overlying the first electrode and a second electrode overlying the first phase change layer. FIG. 8 illustrates a cross-sectional view 800 corresponding to some embodiments of act 1206.

At 1208, a masking layer is formed over the memory cell stack. The masking layer covers a memory region of the memory cell stack that overlies the conductive via while leaving a sacrificial region of the memory cell stack to sides of the conductive via exposed. FIG. 9 illustrates a cross-sectional view 900 corresponding to some embodiments of act 1208.

At 1210, an etching process is performed to remove a portion of the memory cell stack within the sacrificial region, thereby defining a PCM structure. FIG. 10 illustrates a cross-sectional view 1000 corresponding to some embodiments of act 1210.

Figure 13:
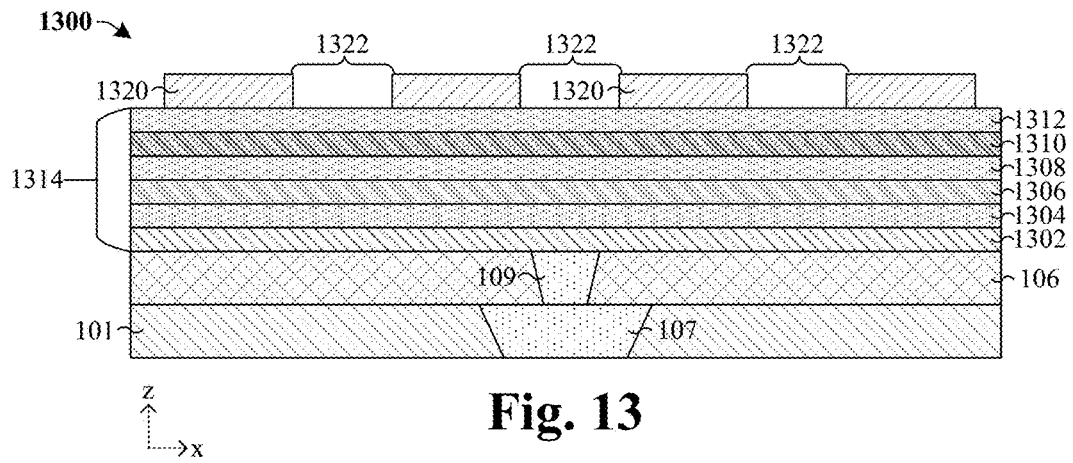
FIGS. 13, 14, 15, 16A, and 16B illustrate cross-sectional views of some embodiments of a method of forming a memory device including a selector and a PCE.
Figure 14:
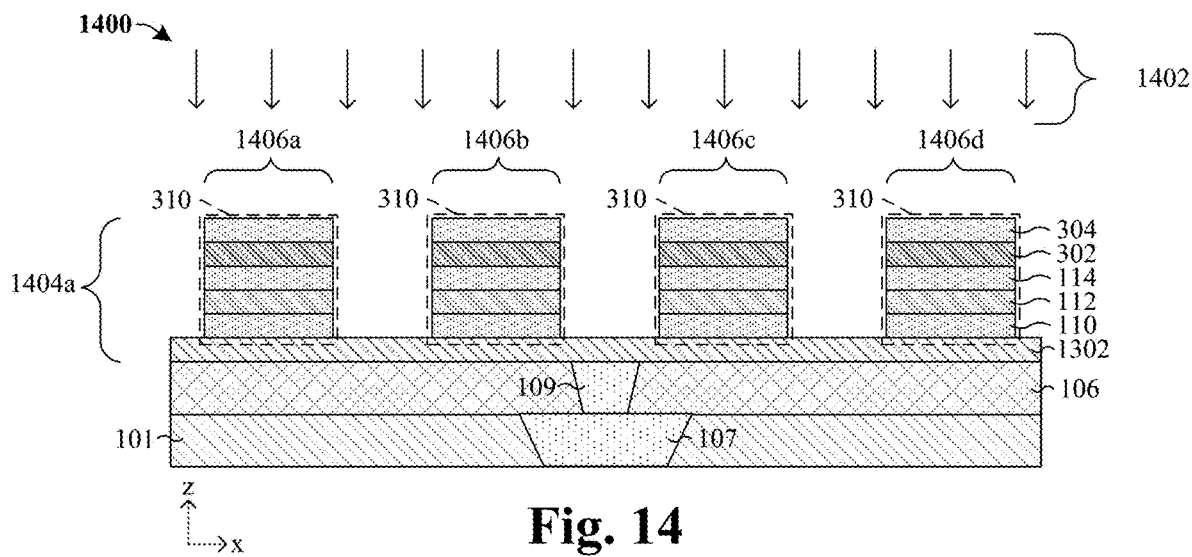
Figure 15:
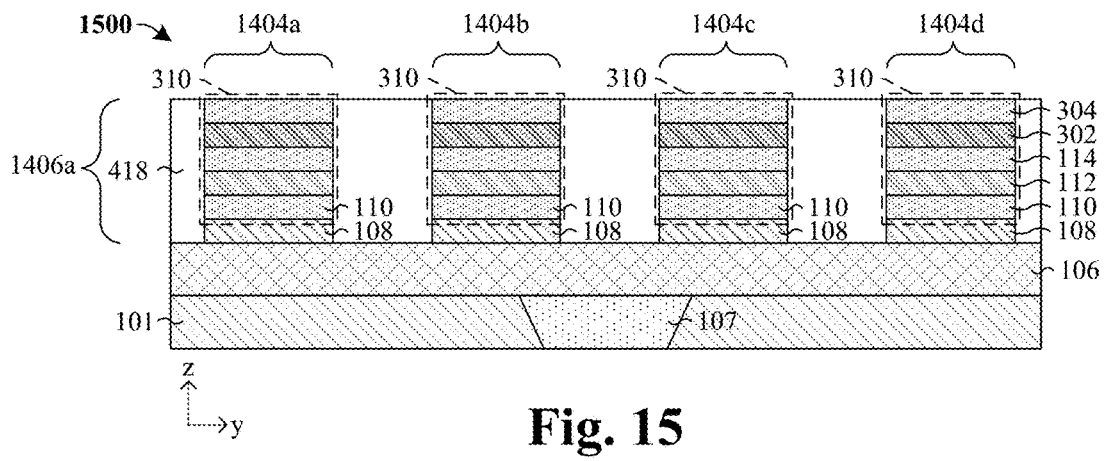
Figure 16A:
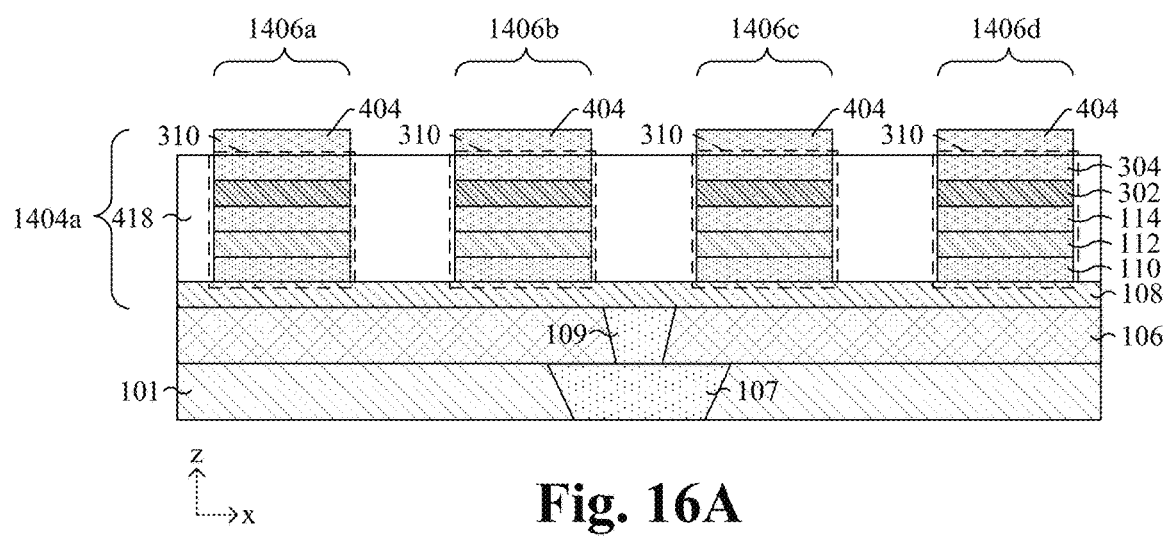
Figure 16B:
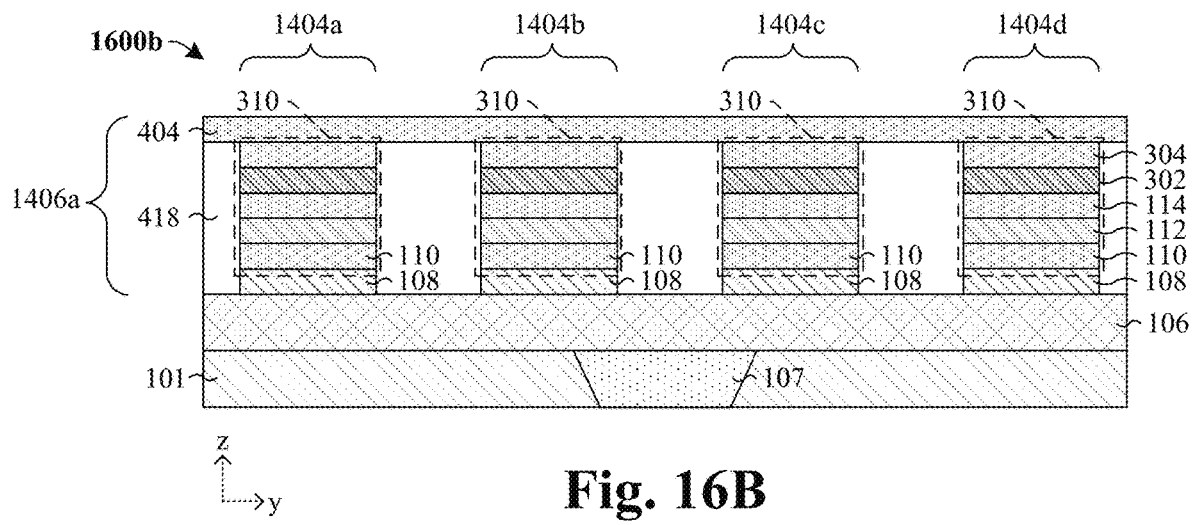

FIGS. 13, 14, 15, 16A, and 16B illustrate cross-sectional views 1300, 1400, 1500, 1600a, 1600b of some embodiments of a method of forming a memory device including a plurality of 1S1MC stacks according to the present disclosure. FIGS. 13, 14, and 16A are in the z-x plane, whereas FIGS. 15 and 16B are in the in the z-y plane. Although the cross-sectional views 1300, 1400, 1500, 1600a, 1600b shown in FIGS. 13, 14, 15, 16A, and 16B are described with reference to a method, it will be appreciated that the structures shown in FIGS. 13, 14, 15, 16A, and 16B are not limited to the method but rather may stand alone separate of the method. Although FIGS. 13, 14, 15, 16A, and 16B are described as a series of acts, it will be appreciated that these acts are not limiting in that the order of the acts can be altered in other embodiments, and the methods disclosed are also applicable to other structures. In other embodiments, some acts that are illustrated and/or described may be omitted in whole or in part.

As shown in the cross-sectional view 1300 of FIG. 13, a first metal wire 107 is formed within a first IMD layer 101. A dielectric layer 106 is formed over the first metal wire 107 and the first IMD layer 101. A bottom electrode via 109 is formed within the dielectric layer 106 directly above the first metal wire 107. 1S1MC layers 1314 are formed over the bottom electrode via 109 and dielectric layer 106. The 1S1MC layers 1314 include: a getter film 1302; a bottom electrode film 1304 overlying the getter film 1302; a PCE film 1306 overlying the bottom electrode film 1304; a first electrode film 1308 overlying the PCE film 1306; a second PCE film 1310 overlying the first electrode film 1308; and a second metal film 1312 overlying the second PCE film 1310. In alternative embodiments, the getter film 1302 overlies the bottom electrode film 1304, between the bottom electrode film 1304 and the PCE film 1306. A masking layer 1320 overlies the second metal film 1312 and comprises a plurality of opposing sidewalls defining a plurality of openings 1322 exposing an upper surface of the second metal film 1312 in multiple locations. In some embodiments, the openings 1322 are formed in a plurality of rows and a plurality of columns defining an array.

In some embodiments, the masking layer 1320 may be formed by a first deposition process. The first deposition process, may for example be performed by a CVD, PVD, some other suitable deposition process(es), or any combination of the foregoing. In some embodiments, the first deposition process may, for example, be performed with a high thermal temperature (e.g., approximately 400 degrees Celsius). In some embodiments, the first deposition process is performed by a CVD process with a temperature up to approximately 400 degrees Celsius and the getter film 1302 prevents and/or blocks outgassing of the outgas species to layers within the 1S1MC layers 1314 above the getter film 1302.

As shown in the cross-sectional view 1400 of FIG. 14, a first etching process is performed to remove a portion of the 1S1MC layers (1314 of FIG. 13) directly beneath the plurality of openings (1322 of FIG. 13), thereby defining a plurality of 1S1MC stacks 310. Each 1S1MC stack 310 in the plurality of 1S1MC stacks 310 includes: a first electrode 110, a PCE 112, a second electrode 114, a second PCE 302, and a third electrode 304. In some embodiments, the first etching process is carried out by exposing the masking layer (1320 of FIG. 13) and the 1S1MC layers (1314 of FIG. 13) to an etchant 1402. In some embodiments, after performing the first etching process, an etching process or some other suitable process is performed to remove any remaining portion(s) of the masking layer (1320 of FIG. 13).

In various embodiments, the plurality of 1S1MC stacks 310 are arranged in a matrix comprising columns 1406a, 1406b, 1406c, 1406d and rows (can only view row 1404a in cross-sectional view 1400). It can be appreciated that there may be any number of 1S1MC stacks 310 within any number of rows and columns, thus FIG. 14 is merely an example. The row 1404a of the plurality of 1S1MC stacks 310 can be viewed in the z-x plane.

As shown in the cross-sectional view 1500 of FIG. 15, A second etching process is performed to remove a portion of the getter film (1302 of FIG. 14), thereby defining a plurality of getter lines 108. Each first electrode 110 of the plurality of 1S1MC stacks 310 is respectively disposed between each PCE 112 of the plurality of 1S1MC stacks 310 and a getter line 108 in the plurality of getter lines 108. In some embodiments, the first etching process is independent of the second etching process. In some embodiments, the second etching process comprises: 1) forming a second masking layer (not shown) over the plurality of 1S1MC stacks 310 and the getter film (1302 of FIG. 14) 2) patterning the getter film (1302 of FIG. 13) according to the second masking layer defining the plurality of getter lines 108.

Each row in rows 1404a, 1404b, 1404c, 1404d of the plurality of 1S1MC stacks 310 are respectively connected to a getter line 108 within the plurality of getter lines 108. The column 1406a of the plurality of 1S1MC stacks 310 can be viewed in the z-y plane and the column 1406a includes the plurality of getter lines 108 disposed within the rows 1404a, 1404b, 1404c, 1404d. In various embodiments, each getter line 108 in the plurality of getter lines 108 defines a row (e.g., row 1404a and/or a word line) in the matrix. In various embodiments, the second etching process is performed in such a manner to form M (M is a whole number 1 or greater) getter lines 108 (e.g., M word lines).

In some embodiments, after performing the second etching processes, an etching process or some other suitable process is performed to remove any remaining portion(s) of the second masking layer (not shown). After performing the etching process, an inter-metal dielectric (IMD) layer 418 is formed between each 1S1MC stack 310 in the plurality of 1S1MC stacks 310. In various embodiments, after forming the IMD layer 418, a planarization process is performed to remove any remaining portion(s) of the IMD layer 418 above an upper surface of the third electrode 304.

As shown in the cross-sectional view 1600a of FIG. 16A in the z-x plane, a plurality of first conductive lines 404 (e.g., bit lines) are formed over the plurality of 1S1MC stacks 310 arranged in the columns 1406a, 1406b, 1406c, 1406d. Each column in the columns 1406a, 1406b, 1406c, 1406d of the plurality of 1S1MC stacks 310 are respectively connected to a first conductive line 404 in the plurality of first conductive lines 404. In various embodiments, the plurality of first conductive lines 404 are formed by first forming a conductive layer over the plurality of 1S1MC stacks 310 arranged in the matrix and then forming a masking layer (not shown) comprising a plurality of opposing sidewalls defining a plurality of openings over the conductive layer. Then, the conductive layer is etched according to the masking layer defining the plurality of first conductive lines 404. In various embodiments, the plurality of first conductive lines 404 extend along a first direction perpendicular to a second direction the plurality of getter lines 108 extend along.

As shown in the cross-sectional view 1600b of FIG. 16B in the z-y plane, each row in the rows 1404a, 1404b, 1404c, 1404d of the plurality of 1S1MC stacks 310 is connected to a first conductive line 404 in the plurality of first conductive lines 404. The column 1406a of the plurality of 1S1MC stacks 310 can be viewed in the z-y plane and the column 1406a includes the plurality of getter lines 108 disposed within the rows 1404a, 1404b, 1404c, 1404d directly under the first conductive line 404. In various embodiments, each first conductive line 404 in the plurality of first conductive lines 404 defines a column (e.g., column 1406a and/or a bit line) in the matrix. In various embodiments, the etching process is performed in such a manner to form N (N is a whole number 1 or greater) first conductive lines 404 (e.g., N bit lines).

Figure 17:
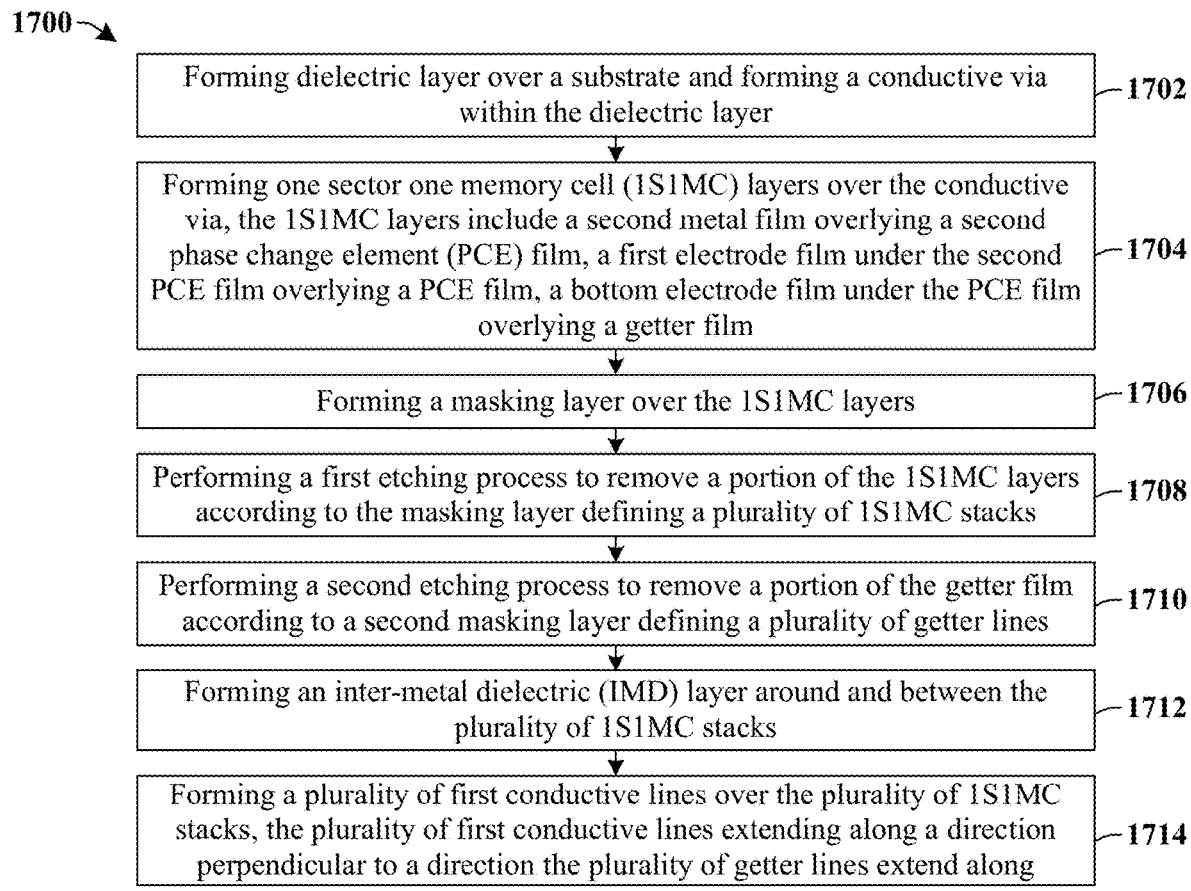
FIG. 17 illustrates a flowchart of some embodiments of a method of forming the method of FIGS. 13, 14, 15, 16A, and 16B.

FIG. 17 illustrates a method 1700 of forming a memory device including a plurality of 1S1MC stacks according to the present disclosure. Although the method 1700 is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At 1702, a dielectric layer is formed over a substrate and a conductive via is formed within the dielectric layer. FIG. 13 illustrates a cross-sectional view 1300 corresponding to some embodiments of act 1602.

At 1704, one selector one memory cell (1S1MC) layers are formed over the conductive via. The 1S1MC layers include a getter film, a bottom electrode film overlying the getter film, a PCE film overlying the bottom electrode film, a first electrode film overlying the PCE film, and a second PCE film overlying the first electrode film, and a second metal film overlying the second PCE film. FIG. 13 illustrates a cross-sectional view 1300 corresponding to some embodiments of act 1704.

At 1706, a masking layer is formed over the 1S1MC layers. FIG. 13 illustrates a cross-sectional view 1300 corresponding to some embodiments of act 1706.

At 1708, a first etching process is performed to remove a portion of the 1S1MC layers according to the masking layer defining a plurality of 1S1MC stacks. FIG. 14 illustrates a cross-sectional view 1400 corresponding to some embodiments of act 1708.

At 1710, a second etching process is performed to remove a portion of the getter film according to a second masking layer defining a plurality of getter lines. FIG. 15 illustrates a cross-sectional view 1500 corresponding to some embodiments of act 1710.

At 1712, an inter-metal dielectric (IMD) layer is formed around and between the plurality of 1S1MC stacks. FIG. 15 illustrates a cross-sectional view 1500 corresponding to some embodiments of act 1712.

At 1714, plurality of first conductive lines are formed over the plurality of 1S1MC stacks, the plurality of first conductive lines extend along a direction perpendicular to a direction the plurality of getter lines extend along. FIGS. 16A and 16B illustrate cross-sectional views 1600a and 1600b corresponding to some embodiments of act 1614.

Accordingly, in some embodiments, the present application relates to a memory device that comprises a getter layer formed between a conductive via and a memory storage layer.

In various embodiments, the present application provides a memory cell including: a bottom electrode overlying a substrate; a data storage structure overlying the bottom electrode; a top electrode overlying the data storage structure, wherein sidewalls of the top electrode and sidewalls of the bottom electrode are aligned; and a getter layer abutting the bottom electrode.

In various embodiments, the present application provides a memory device including: a via overlying a substrate; a first memory cell overlying the via, wherein the first memory cell comprises a top electrode, a bottom electrode, and a data storage structure disposed between the top and bottom electrodes, wherein sidewalls of the top electrode, sidewalls of the bottom electrode, and sidewalls of the data storage structure are aligned; and a getter layer between the first memory cell and the via, wherein the getter layer contacts the bottom electrode.

In various embodiments, the present application provides a method for forming a memory device, the method includes: depositing a memory cell stack over a substrate, wherein the memory cell stack includes a first electrode, a getter layer abutting the first electrode, a data storage layer overlying the first electrode, and a second electrode overlying the data storage layer; and performing a first patterning process on the memory cell stack to define a first memory cell such that sidewalls of the second electrode and sidewalls of the data storage layer are aligned.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory cell comprising:
a bottom electrode overlying a substrate;
a data storage structure overlying the bottom electrode;
a top electrode overlying the data storage structure, wherein sidewalls of the top electrode and sidewalls of the bottom electrode are aligned; and
a getter layer abutting the bottom electrode, wherein the getter layer is between the bottom electrode and the substrate.

2. The memory cell of claim 1, wherein the getter layer comprises a conductive material configured to absorb an outgas species.

3. The memory cell of claim 1, wherein the getter layer directly contacts the bottom electrode.

4. The memory cell of claim 1, further comprising:
a conductive via underlying the bottom electrode; and
wherein the getter layer comprises the conductive via such that the getter layer and the conductive via comprise a single material.

5. The memory cell of claim 1, wherein the getter layer comprises first grains and the bottom electrode comprises second grains larger than the first grains.

6. The memory cell of claim 1, further comprising:
a middle electrode overlying the data storage structure; and
a second data storage structure between the middle electrode and the top electrode.

7. A memory device comprising:
a via overlying a substrate;
a first memory cell overlying the via, wherein the first memory cell comprises a top electrode, a bottom electrode, and a data storage structure disposed between the top and bottom electrodes, wherein sidewalls of the top electrode, sidewalls of the bottom electrode, and sidewalls of the data storage structure are aligned; and
a getter layer between the first memory cell and the via, wherein the getter layer contacts the bottom electrode.

8. The memory device of claim 7, wherein sidewalls of the getter layer extend laterally past sidewalls of the first memory cell.

9. The memory device of claim 7, further comprising:
a second memory cell overlying the getter layer, wherein the second memory cell comprises a second top electrode, a second bottom electrode, and a second data storage structure between the second top electrode and the second bottom electrode, wherein the second bottom electrode contacts the getter layer; and
wherein sidewalls of the first and second memory cells are respectively spaced laterally between sidewalls of the getter layer.

10. The memory device of claim 9, wherein the getter layer comprises a single material that continuously laterally extends from the first memory cell to the second memory cell.

11. The memory device of claim 10, wherein the single material is configured to absorb an outgas species.

12. The memory device of claim 7, a bottom surface of the bottom electrode contacts a top surface of the getter layer.

13. The memory device of claim 7, wherein a maximum width of the getter layer is greater than a maximum width of the first memory cell.

14. The memory device of claim 7, further comprising:
a conductive wire overlying the first memory cell, wherein sidewalls of the conductive wire are spaced laterally between sidewalls of the getter layer.

15. A method for forming a memory device, the method comprising:
depositing a memory cell stack over a substrate, wherein the memory cell stack includes a bottom electrode, a getter layer abutting and underlying the bottom electrode, a data storage layer overlying the bottom electrode, and a top electrode overlying the data storage layer; and
performing a first patterning process on the memory cell stack to define a first memory cell such that sidewalls of the top electrode and sidewalls of the data storage layer are aligned.

16. The method of claim 15, wherein sidewalls of the getter layer extend laterally past sidewalls of the first memory cell after performing the first patterning process.

17. The method of claim 16, wherein the first patterning process does not etch through an entire thickness of the getter layer.

18. The method of claim 15, wherein performing the first patterning process on the memory cell stack further defines a second memory cell over the getter layer, wherein the second memory cell is laterally offset from the first memory cell by a non-zero distance, and wherein the getter layer continuously laterally extends across the non-zero distance.

19. The memory cell of claim 1, further comprising:
a dielectric layer underlying the getter layer; and
a conductive via disposed within the dielectric layer, wherein the conductive via contacts the getter layer.

20. The memory cell of claim 19, wherein a lower surface of the getter layer is disposed along an upper surface of the dielectric layer.

* * * * *